(12) United States Patent
Scorticati et al.

(10) Patent No.: US 11,067,434 B2
(45) Date of Patent: Jul. 20, 2021

(54) FAST DETECTOR OF ELECTROMAGNETIC RADIATION

(71) Applicant: LASER POINT s.r.l., Vimodrone (IT)

(72) Inventors: Davide Scorticati, Milan (IT); Sergio Pellegrino, Merate (IT); Giacomo Crapella, Milan (IT)

(73) Assignee: LASER POINT S.R.L., Vimodrone (IT)

( * ) Notice: Subject to any disclaimer, the term of this patent is extended or adjusted under 35 U.S.C. 154(b) by 55 days.

(21) Appl. No.: 16/621,801

(22) PCT Filed: Jun. 20, 2018

(86) PCT No.: PCT/EP2018/066474
§ 371 (c)(1),
(2) Date: Dec. 12, 2019

(87) PCT Pub. No.: WO2018/234406
PCT Pub. Date: Dec. 27, 2018

(65) Prior Publication Data
US 2021/0156737 A1    May 27, 2021

(30) Foreign Application Priority Data
Jun. 23, 2017  (IT) .................... 102017000070601

(51) Int. Cl.
*G01J 1/42*         (2006.01)
*H01L 31/0368*  (2006.01)
(Continued)

(52) U.S. Cl.
CPC . *G01J 1/42* (2013.01); *G01J 5/12* (2013.01); *H01L 31/0368* (2013.01); *H01L 35/34* (2013.01); *G01J 2001/4295* (2013.01)

(58) Field of Classification Search
CPC ........ G01J 1/42; G01J 5/12; G01J 2001/4295; H01L 35/34; H01L 31/0368
See application file for complete search history.

(56) References Cited

U.S. PATENT DOCUMENTS

| 5,678,924 A | 10/1997 | Naquin et al. |
| 2001/0007707 A1 | 7/2001 | Kinder et al. |

(Continued)

FOREIGN PATENT DOCUMENTS

| JP | 2001135868 | 5/2001 |
| WO | WO 2016/128247 | 8/2016 |

OTHER PUBLICATIONS

International Search Report dated Jan. 22, 2019.
(Continued)

*Primary Examiner* — Seung C Sohn
(74) *Attorney, Agent, or Firm* — Jacobson Holman PLLC (57) ABSTRACT

A detector of electromagnetic radiation (RL) is described. The detector comprises:
a substrate (1),
an oriented polycrystalline layer (2) of thermoelectric material deposited on the top surface (10) of the substrate,
first and second electrodes spaced the one from the other and in electrical contact with the oriented polycrystalline layer. The substrate comprises at least one ceramic layer and the oriented polycrystalline layer has a crystal orientation at an angle comprised between 30 degrees and 55 degrees relative to a normal to the top surface of the substrate.

18 Claims, 3 Drawing Sheets

(51) Int. Cl.
*G01J 5/12* (2006.01)
*H01L 35/34* (2006.01)

(56) References Cited

U.S. PATENT DOCUMENTS

| | | |
|---|---|---|
| 2003/0234037 A1* | 12/2003 | Tanaka .................. H01L 35/32 136/205 |
| 2004/0102051 A1 | 5/2004 | Bottner et al. |
| 2010/0126548 A1* | 5/2010 | Jang ...................... H01L 35/32 136/230 |
| 2011/0024604 A1 | 2/2011 | Takahashi et al. |
| 2011/0291012 A1 | 12/2011 | Takahashi et al. |
| 2014/0091304 A1 | 4/2014 | Semerad et al. |
| 2014/0091307 A1 | 4/2014 | Semerad et al. |
| 2017/0179363 A1 | 6/2017 | Hayashi et al. |

OTHER PUBLICATIONS

Chun Hung Suen et al. Enhanced thermoelectric properties of SnSe thin films grown by pulsed laser glancing-angle deposition. Journal of Materiomics, vol. 3, No. 4, Jun. 9, 2017.

Zhao et al. Designing nanostructures by glancing angle deposition. Proceedings of SPIE, vol. 5219, Oct. 27, 2003, p. 59.

Ziepl et al. Properties of thermoelectric nanocomposite Bi2Te3 layers prepared by PLD. Sensors & Transducers, vol. 183, No. 12, Dec. 1, 2014, pp. 103-109.

* cited by examiner

FAST DETECTOR OF ELECTROMAGNETIC RADIATION

BACKGROUND OF THE INVENTION

The present invention relates to a fast detector of electromagnetic radiation, particularly of laser radiation.

Fast laser-radiation detectors nowadays are mainly represented by photodiodes, pyroelectric sensors and axial thermoelectric devices. Thermoelectric devices are subdivided into two different groups: the devices using the standard longitudinal thermoelectric effect induced at the junction of different types of materials and the devices based on the laser induced transverse voltage (LITV) effect.

The main advantage of photodiodes over other types of sensors is the fastest response timewise. Based on the recombination mechanism of electron-hole pairs in P-N junctions, sub-nanosecond response time can be achieved by devices utilizing this physical principle. Moreover, the high sensitivity of those devices allows the measurement of extremely low power continuous wave-laser beams and single laser pulses. By contrast, the high sensitivity implicates a low saturation threshold while measuring laser-radiation. The response of photodiodes suffers of spatial non-uniformity and the dependence on the operating temperature and on the wavelength of the impinging radiation. Besides, the spectral working band is physically limited by the energy gap of the semiconductors in use.

Sensors based on the pyroelectric effect transduce a thermal gradient into an electric signal. That is, the polarization change due to a thermal gradient gives rise to a voltage across the crystal. On the one hand, pyroelectric sensors do have the advantage over photodiodes to be broadband (i.e. from UV to THz) benefiting from their thermal nature. Besides, they also combine the high sensitivity (which can be higher or equal to 1000 V/W) with the possibility to be tailored in their design for high energy pulses. On the other hand, pyroelectric sensors are limited to relatively low laser repetition rates (currently up to 200 kHz) and the inability to measure continuous wave (cw) laser radiation, due to the natural leakage current across the active material. In fact, the working principle of pyroelectric materials, based on the response to transient changes of temperature, allows just measurements of pulsed to quasi-cw, but not purely cw or long pulsed laser sources.

Sensors based on the standard longitudinal thermoelectric effect are commonly designed adopting multiple electrically interconnected thermocouples, which can measure a heat flux axially across a suitable substrate. This type of sensors using the standard thermoelectric effect are an evolution of the common radial thermopile design described in U.S. Pat. No. 5,678,924. Working on a thermal principle, the spectral acceptance region of this kind of sensors is still broadband. However, the thermal design of this kind of sensors only allows for relatively slow response times (currently greater than 10 ms). Moreover, the design of multiple axial thermocouples often implies a scarce coverage of the active area of the sensor (as disclosed in WO2016128247).

Sensors using the laser induced transverse voltage (LITV) effect also transduce a thermal gradient into an electric signal. Thin films of suitable materials (e.g. Bi, $Bi_2Te_3$, Al:ZnO, Sb), deposited with a slant angle between the evaporation source and the substrate are known to show a transverse thermoelectric response to laser-irradiation. That is, if a thermal gradient is present along the normal direction to the film surface, a thermoelectric response is generated, longitudinally to the plane of the film surface. The intensity of the generated electric signal, extractable along the longitudinal plane, has a well-defined direction and it is parallel to the projection of the angled grains of the thin film active material grown onto the substrate, showing a minimum in the coplanar perpendicular direction.

The adoption of the LITV effect has the intrinsic advantage of showing a good conversion efficiency of a thermal signal into an electric voltage, while showing response times in the nanosecond timescale. Besides, the fabrication of the device results more controllable as it requires less technological steps, hence resulting cheaper and simplified. Another advantage of the LITV based devices over standard thermoelectric devices is the uniform coverage of the active area, with respect to a design based on axially disposed thermocouples.

The advantage of sensors using the LITV effect over pyroelectric sensors and photodiodes for laser radiation measurement is the combination of an overall fast response time, broadband spectral acceptance, high saturation threshold to direct laser irradiation and the possibility to measure pulsed as well as cw-laser sources. Moreover, the active area of LITV based sensors does not have limitations in size, compared to fast photodiodes and pyroelectric sensors, whereas the uniformity of the deposition of the active film is maintained.

Although sensors based on the LITV effect are very promising in the technological area of laser radiation energy/power sensing, a limitation is posed by the disadvantageous requirement of complex alloys-often composed by toxic materials—for the production of the active layer, as the sensors of US 2011/0024604 A1, US 2011/0291012 A1, US 2014/0091307 A1 or US 2014/0091304 A1.

Moreover, fabrication methods disclosed by previous patents (US 2011/0024604 A1, US 2011/0291012 A1, US 2014/0091304 A1 and US 2014/0091307 A1) describe epitaxial-like growth of the active tilted nearly lattice-matched thermoelectric layer onto the crystal substrate. This approach poses strong limitations regarding the materials usable for the active film and the substrate, i.e. it requests nearly lattice matched materials pairs, as clearly evidenced by TEM images in US 2011/0024604 A1, and widely known from technical literature. Furthermore, US 2004/0102051 A1 describes different embodiments of manufacturing methods based on the use of seed layer and artificial tilted structures to force the deposition on the preferred crystal plane of the thermoelectric material, restricted to V-VI compounds.

In fact, within the above-mentioned patent applications, there is the requirement of either a determined atomic configuration of the substrate (i.e. a specific material with a specific crystallographic plane), or the presence of an additional seed buffer layer again with a determined atomic configuration between the active layer and the substrate. Such determined atomic structure of the seed buffer layer is needed to influence an epitaxial-like growth of a highly crystalline film with a specific angle respect to the substrate during the deposition of the active film, adding complexity to the manufacturing as well as a supplementary and critical processing step.

In particular, US 2011/0024604 A1 describes a method of growing $Ca_xCoO_2$ tilted films onto two specific planes of the $Al_2O_3$ substrate, specifically the n-plane and the s-plane, which generate inclination angles of the $Ca_xCoO_2$ planes of 62° and 70° respectively, with respect to the surface of the substrate.

US 2011/0291012 A1 discloses different embodiments, whereas the growth of the active tilted thermoelectric layer is still dependent on the atomic structure of the substrate. In fact US 2011/0291012 A1 discloses that, "the inclination angle α of the crystal planes 35 of the inclined thin film 32 is determined according to the inclination angle β of the low-index planes 34 of the inclined substrate 31, and a satisfies α=β+θ, where θ is 0 to 10 degrees".

US 2014/0091304 A1 discloses a fabrication method of tilted thermoelectric films from the groups of dysprosium barium cuprate ($DyBa_2Cu_3O_7$-d), strontium sodium cobaltate ($Sr_{0.3}Na_{0.2}CoO_2$), and strontium cobaltate ($Sr_3Co_4O_9$), which require an intermediate seed buffer layer of materials such as magnesium oxide (MgO), yttrium stabilized zirconia (YSZ) and cerium oxide ($CeO_2$). The seed buffer layer must have a columnar grain structure with crystal axis (c-axis) tilted at an angle α in the direction of the by between about 10-degrees and about 45 degrees, relative to a normal to the substrate surface.

In US 2004/0102051 A1, again a seed layer is adopted in order to orientate the grains of the active thermoelectric material with respect to the surface of the substrate. Furthermore US 2004/0102051 A1 discloses the use of similar active materials for fabricating their device, not only requires a seed layer but also an additional post deposition annealing treatment to orientate the c-axis of the thermoelectric layer at a suitable angle. The latter adds an additional complexity to the manufacturing, reducing the robustness of the overall industrial process, compared to the fabrication method adopted by the present invention. Besides, US 2004/0102051 A1 discloses in one embodiment the use of etched roof-tile-shaped structures on the substrate silicon surface, which must be then covered with an oxide. The substrate is then rotated with the same angle of the structures with respect to the evaporation source, in order to obtain a more rapid growth of vertical grains with respect to the etched structures. Those grains have then an angle with respect to the original surface of the substrate. Again, the described procedure adds additional complexity to the manufacturing, reducing the robustness of the overall industrial process, compared to the fabrication method adopted by the present invention.

In view of the state of the art, it is an object of the present to provide a fast detector of laser radiation which is different from prior art and overcomes the disadvantages of the prior art, i.e. that does not make use of any seed layer, does not need highly crystalline oriented substrates and does not request the formation of artificial structures on the substrate.

SUMMARY OF THE INVENTION

According to the present invention, said object is achieved by means of a detector of electromagnetic radiation, comprising:
a substrate,
an oriented polycrystalline layer of thermoelectric material deposited on the top surface of the substrate,
first and second electrodes spaced the one from the other and in electrical contact with the oriented polycrystalline layer, characterized in that said substrate comprises at least one ceramic layer and said oriented polycrystalline layer has a crystal orientation at an angle comprised between 30 degrees and 55 degrees relative to a normal to the top surface of the substrate.

The present invention describes fast detector of laser radiation which is easy to produce, reliable, and is based on the LITV effect for the measurement of direct laser radiation. Its response uniformity over the entire active area of the sensor is not varied within a broad range of roughness of the substrate, hence determining a robust process stability.

The detector according to the present invention is capable of measuring the energy of single laser pulses with repetition frequencies up to the MHz range, adding the possibility to also measure the output power of cw lasers. Moreover, the thermal nature of the sensor enables the capability to work in a broadband spectrum, from UV to THz as well as the possibility of operating in a broad-range ($10^{-3}$-$10^2$ W/cm$^2$) of incident optical power densities of the laser radiation RL, without the need of adopting optical filters or other precautions.

Also, the detector of laser radiation allows a fast rise time in the order of $10^{-10}$ s.

The detector according to the present invention comprises a substrate of a suitable ceramic material without the requirement of a specific crystallographic plane, e.g. sintered ceramics, such as aluminum nitride (AlN), silicon nitride ($Si_3N_4$), silicon carbide (SiC), boron nitride (BN), boron carbide ($B_4C$), alumina ($Al_2O_3$), or beryllium oxide (BeO). Alternatively, a metallic substrate may be used, previously passivated by a dielectric thin polycrystalline layer of ceramics provided with a good thermal conduction coefficient (e.g. AlN, $Si_3N_4$, SiC, BN, $B_4C$, $Al_2O_3$, BeO).

On one side of the substrate, a thin (0.1-5 μm) polycrystalline active element of a selected thermoelectric material (e.g. Bi, $Bi_2Te_3$, Al:ZnO, Sb) is deposited with crystal orientation at a first angle between 30° and 55°, with an optimum at 45°. The substrate is not oriented as the thin polycrystalline layer.

One main difference between the present invention and the previous inventions consists in that the active element is not highly-crystalline but is highly multi-crystalline, instead. The adoption of the GLAD technique to fabricate the active film of the sensor permits the use of substrates without a specific atomic configuration, such as sintered ceramic layers without the need of depositing seed layers with specific atomic configurations nor an expensive lapping procedure to control its surface roughness, adding robustness to the industrial fabrication method.

Formed on top of the active material, a thin adhesion layer (<20 nm) consisting of Ti is adopted between the active material and the passivation layer, composed of a thin film of platinum or palladium (80-100 nm) or titanium oxide. This layer can also be used as absorption layer for the incident laser radiation.

Following, when required, an additional absorption layer of different materials (e.g. SiC, $Si_3N_4$, $Al_2O_3$, black textured metallic layers, or Carbon Nanotubes Composite Coating) and variable thickness (0-10 μm) may be added both to better absorb different ranges of wavelengths as well as to increase the damage threshold of the sensor to laser radiation.

In another embodiment, texturing of the substrate with adjacent V-shaped grooves in the same direction as the projection of the tilted grains of the active layer onto the substrate, before the deposition of the active layer, can be adopted to increase the optical absorption of the impinging laser radiation.

The active material, as well as the subsequent layers must be shaped in the form of adjacent closely packed, electrically isolated strips. The strips must be parallel to the direction of the projection of the tilted grains onto the substrate.

A metallic conductive layer in electrical contact with the active layer is configured for interconnecting either in series or in parallel the extremities of the strips of the active layer by forming a sensor chip.

The sensor chip is then attached on its back surface (the back surface of the substrate) to a suitable heatsink either by a thermally conductive adhesive or by bonding using metallic solders.

DESCRIPTION OF THE DRAWINGS

For a better understanding of the present invention, some embodiments thereof are now described, purely by way of non-limiting examples and with reference to the annexed drawings, wherein.

Figure 1:
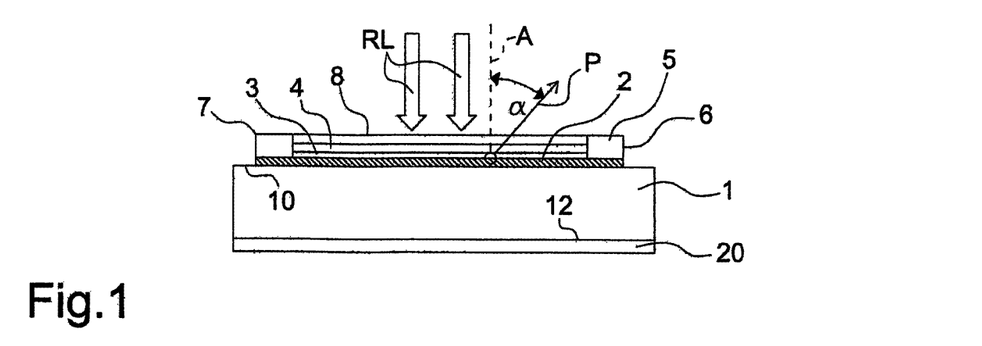
FIG. 1 is a cross-section view of a fast detector for laser radiation in accordance with an embodiment of the present invention.

Referring to FIG. 1 a fast detector of electromagnetic radiation, particularly of laser radiation, according to a preferred embodiment of the present invention is described.

The fast detector of laser radiation in accordance with the present invention comprises a substrate 1 comprising a ceramic layer, preferably a ceramic layer without the requirement of a specific grain orientation, wherein as ceramic material is intended a highly thermally conductive (higher than 100 W/mK) and dielectric material with a high melting temperature (higher than 1800° C.). The substrate 1 may be constituted of the only ceramic layer, preferably a sintered ceramic layer, e.g. sintered aluminum nitride (AlN), sintered silicon nitride ($Si_3N_4$), sintered silicon carbide (SiC), sintered boron nitride (BN), sintered boron carbide ($B_4C$), sintered alumina ($Al_2O_3$), or sintered beryllium oxide (BeO). Otherwise, the substrate may comprise a metallic substrate which has been previously electrically passivated by a thin randomly-oriented ceramic layer with a good thermal conduction coefficient (e.g. AlN, $Si_3N_4$, SiC, BN, $B_4C$, $Al_2O_3$, BeO).

Preferably the top surface 10 of the substrate 1 presents a roughness $R_a$ lower than 2 µm.

On the top surface 10 of the substrate 1, a polycrystalline layer 2 is deposited with crystal orientation at an angle α, preferably comprised between 30 and 55 degrees, relative to the normal A to the top surface 10 of the substrate 1. That is, the polycrystalline layer 2 has a columnar grain structure with a crystal axis P tilted at the angle α with respect to the normal axis A. The inclined oriented crystal structure of the polycrystalline layer 2 needs to provide the desired thermoelectric effect.

The polycrystalline layer 2 is deposited on the top surface 10 of the substrate 1 and is not grown by means of an epitaxial growth. For this reason the material of the substrate 1 does not require a specific grain orientation, as in the prior art, and the substrate 1 may be constituted of the only ceramic layer, preferably a sintered ceramic layer.

The polycrystalline layer 2 is deposited adopting either physical vapor deposition technique (PVD) or electron beam physical vapor deposition (EBPVD) and by placing the substrate 1 at the slant angle α with respect to the evaporation source, by means of the well-known glancing angle deposition technique (GLAD). The latter forms a tilted highly multi-crystalline grain structure of the deposited active layer. The GLAD technique is well described in Chapter 13—Glancing Angle Deposition, In Handbook of Deposition Technologies for Films and Coatings (Third Edition), edited by Peter M. Martin, William Andrew Publishing, Boston, 2010, Pages 621-678, ISBN 9780815520313, https://doi.org/10.1016/B978-0-8155-2031-3.00013-2. In order to obtain the polycrystalline layer 2 with crystal orientation at the angle α, the partial pressure inside the deposition chamber during evaporation must be in the range of $10^{-3}$-$10^{-7}$ mbar, the deposition rate in the range of 0.1-1000 nm/s and the substrate temperature between 293-500 K. Preferably, the polycrystalline layer 2 is deposited with crystal orientation at 45 degrees for obtaining an optimum deposition.

The polycrystalline layer 2 is a thin layer; preferably the thickness of the polycrystalline layer 2 is comprised between 0.1 µm and 5 µm. The polycrystalline layer 2 represents the active layer of the fast detector of laser radiation and the above-mentioned thickness is suitable for quickly restoring thermal gradient across the polycrystalline layer 2.

Figure 8A:
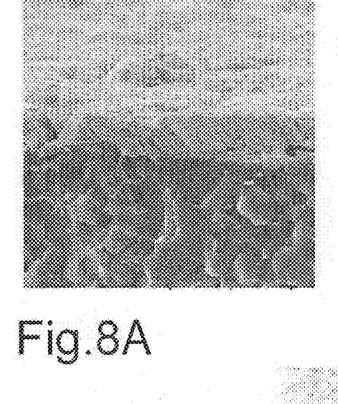
FIG. 8A and FIG. 8B are scanning electron microscope images of two different thicknesses of the active layer on a ceramic substrate of the detector in FIG. 1.
Figure 8B:
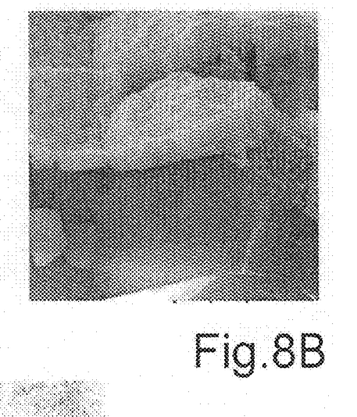

The material of the polycrystalline layer 2 is a material selected from a group of thermoelectric material comprising e.g. bismuth (Bi), bismuth telluride ($Bi_2Te_3$), aluminum doped zinc oxide (Al:ZnO) or antimony (Sb). FIGS. 8a and 8b show two active layers of different thickness which are deposited onto the substrate 1.

The roughness $R_a$ of the top surface of the substrate 1 helps the adhesion of the active material layer 2 to the substrate 1 preventing delamination and increases the diffused reflection of the detector.

Even a relatively high roughness (>0.6 um) can be adopted without affecting the transverse thermoelectric properties of films with thickness lower than 500 nm. In fact, as long as the average orientation of the tilted grains remains unaltered, the response of the sensor remains globally stable, using a spot with a diameter >>$R_a$.

An adhesion layer 3 is formed on the top surface of the polycrystalline layer 2; the adhesion layer 3 has preferably a thickness lower than 20 nm and preferably consists of titanium.

A passivation layer 4, preferably a highly non-reactive and high melting temperature layer (>1000° C.), is deposited on the top surface of the buffer layer 3; the passivation layer 4 has preferably a thickness ranging from 80 nm to 100 nm and preferably consists of platinum or palladium or titanium oxide.

The layer 3 is configured to act as adhesion layer between the polycrystalline layer 2 and the passivation layer 4.

A metallic conductive contact layer 5 is deposited onto the layer 2 or on the layer 4 in the case wherein the layers 3 and 4 are conductive. The metallic conductive layer 5 is in electrical contact with the polycrystalline layer 2. The metallic conductive layer 5 is deposited so as to form two contacts spaced the one from the other; the contacts of a single strip represent the electrodes 6, 7. The transverse electric field between the electrodes results in a voltage V(t).

The material of the metallic conductive layer 5 may be gold (Au), copper (Cu), silver (Ag) or molybdenum (Mo). Alternately, the metallic conductive layer 5 is made of the same material of the active layer, in order to avoid thermocouple effects at the junctions between the active and the conductive layer 5, which sum up in the case of the serial interconnection of the strips, moving the baseline of the output voltage signal of the sensor. That is, the metallic conductive contact layer 5 may be bismuth (Bi), bismuth telluride ($Bi_2Te_3$), aluminum doped zinc oxide (Al:ZnO) or antimony (Sb).

The sensor chip is then attached on its back side, that is the back surface 12 of the substrate 1, to a suitable heatsink 20 using either a thermally conductive adhesive paste/pad or by a metallic solder.

The passivation layer 4 can act directly as absorber layer for UV-NIR radiation (below 1.1 μm wavelength) when a fast response is required (e.g. >500 MHz).

Thin films of suitable materials (e.g. Bi, $Bi_2Te_3$, Al:ZnO, Sb), deposited with a slant angle between the evaporation source and the substrate are known to show a transverse thermoelectric response to laser-irradiation. That is, if a thermal gradient is present along the normal direction to the film surface, a thermoelectric response longitudinally to the plane of the film surface is generated.

The intensity of the generated electric signal, extractable along the longitudinal plane, has a well-defined direction and it is parallel to the projection of the angled grains of the film of active material grown onto the substrate, showing a minimum in the coplanar perpendicular direction.

The sensor acts as an electromotive force (e.m.f.) generator when irradiated by a radiation laser RL. Its signal is proportional to the temperature gradient formed between the external surface of the active film and its interface with the substrate.

The response of the sensor can be expressed by the formula:

$$V(t) \propto \sin(2\alpha) \cdot (S_\parallel - S_\perp) \cdot \Delta T(t),$$

where α, $S_\parallel$, $S_\perp$ and ΔT are, respectively, the tilt-angle of the grains of the active layer 2 with respect to the normal direction to the substrate plane, the Seebeck coefficient in the direction parallel to the projection of the angled grains of the active layer 2 onto the substrate surface 10, the Seebeck coefficient perpendicular to the substrate surface 10 and the temperature gradient across the film.

Figure 2:
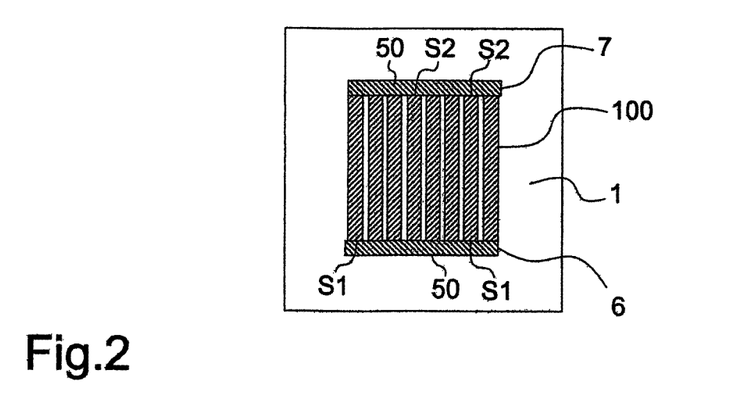
FIG. 2 is a top view of a parallel arrangement of electrodes and patterned sensor layer material for the detector of FIG. 1.
Figure 3:
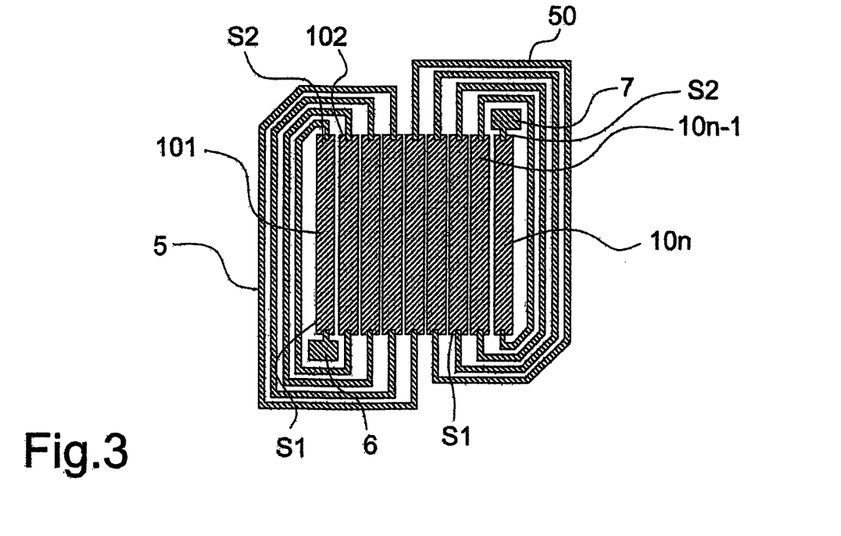
FIG. 3 is a top view of a serial arrangement of electrodes and patterned sensor layer for the detector of FIG. 1.
Figure 4:
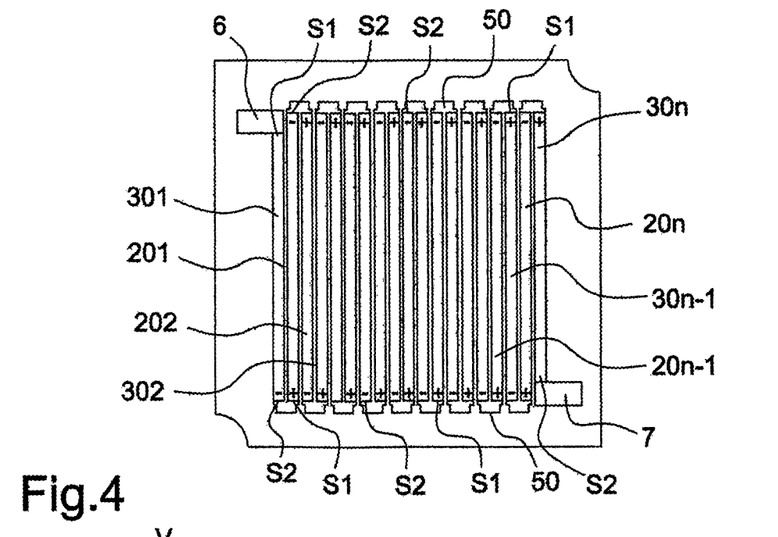
FIG. 4 is a top view of another serial arrangement of electrodes and patterned sensor layer for the detector of FIG. 1.

Preferably the fast detector according to the invention must be patterned into a single strip 100 or a plurality of strips 100, preferably in the form of adjacent closely packed and electrically isolated strips as illustrated in FIGS. 2-4.

Each strip 100 has preferably a width W1 of about 0.5 to 30 mm and a length L1 in the range of 5 to 30 mm. Each strip is parallel to the direction of the projection of the tilted grains onto the substrate 1. The space W2 between two adjacent strips of a plurality of strips must be as small as possible, preferably comprised between 10 um and 100 um, in order to achieve the maximum relative coverage of the substrate by the sensing material. The metal layer 5 provides to form the contacts at the extremities S1 and S2 of each strip; the contacts are spaced the one from the other. The isolation of the strips can be performed either by laser ablation of the detector in FIG. 1 or by a suitable masking of the substrate 1 prior to the deposition of the layers 2-5, 8. The formation of strips 100 serves for two different reasons. First, for better collecting the electric signal at the extremities of the strip. Second, for matching the impedance of the fast sensor according to the invention with the electronics which will digitalize the analogic signal originated from the sensor. Given a fixed rectangular area of the active material and a fixed thickness of the deposited films, the lateral density of the strips is dictated by the electric impedance of the fully interconnected device.

The design of the conductive circuit is chosen in order to optimize the impedance matching with the electronics used for reading the output signals, extracted from the electrodes 6 and 7.

As shown in FIG. 2, the electrodes 6 and 7 are elongated, by means to a metallic layer 50, for interconnecting in parallel (FIG. 2) the contacts at the extremities S1 and S2 of the strips of the active layer 2. In this case each strip 100 extends between the electrodes 6 and 7.

As shown in FIG. 3, the conductive metallic layer 50 is arranged for interconnecting in series the extremities of the strips of the active layer 2. Considering FIG. 3, the first extremity S1 of each strip of the plurality of strips 101 . . . 10n-arranged in succession from the first strip 101 to the last strip 10n—is the bottom extremity. Analogously, the second extremity S2 of each strip of the plurality of strips is the top extremity in FIG. 3. The electrode 6 is placed in contact with the polycrystalline layer 2 of the first extremity S1 of the first strip 101 of the plurality of strips. Electrode 7 is placed in contact with the polycrystalline layer 2 of the second extremity S2 of the last strip 10n of the plurality of strips. The second extremity S2 of the first strip 101 is placed in electrical contact, by means the metallic conductive layer 50, with the first extremity S1 of the second strip 102 of the plurality of strips, and so on.

As shown in FIG. 4, the conductive metallic layer 50 is arranged for interconnecting in series the extremities of the strips of the active layer 2. However, in this case, differently from the detector in FIG. 3, a plurality of alternated strips 201, 301 . . . 20n, 30n with opposite grain orientations are present. That is, the oriented polycrystalline layers of the adjacent strips (201, 301; 202, 302 . . . 20n, 30n) have opposite grain orientations. The dual orientation of the grains is obtained by performing two subsequent depositions of the polycrystalline layers. With the first deposition step, all the alternated strips with one same grain orientation are made, by masking properly the substrate 1 and successively by adopting either physical vapor deposition technique (PVD) or electron beam physical vapor deposition (EBPVD) and placing the substrate 1 at the slant angle α with respect to the evaporation source, by means of the well-known glancing angle deposition technique (GLAD). The second deposition is performed after rotating the substrate by 180 degrees around the axis, which passes from the center of the substrate 1 and is perpendicular to the surface plane. Masking the substrate 1 properly and successively by adopting either physical vapor deposition technique (PVD) or electron beam physical vapor deposition (EBPVD) and placing the substrate 1 at the slant angle α with respect to the evaporation source, by means of the well-known glancing angle deposition technique (GLAD, all the strips with opposite grain orientation, with respect to those obtained during the first deposition, are made.

Said plurality of alternated strips 201, 301 . . . 20n, 30n form a succession of alternated strips 201, 301, 202, 302 . . . 20n, 30n. In this way, the electrode 6 is placed in contact with the polycrystalline layer 4 of the first extremity S1 of the first strip 201 of the plurality of strips 201, 301 ... 20n, 30n. Electrode 7 is placed in contact with the polycrystalline layer 2 of the second extremity S2 of the last strip 30n of the plurality of strips 201, 301 ... 20n, 30n. The second extremity S2 of the first strip 201 is placed in electrical contact, by means the metallic conductive layer 50, with the adjacent first extremity S1 of the first strip 301 of the plurality of strips 201, 301 ... 20n, 30n in the bottom of FIG. 4. The second extremity S2 of the strip 301 is placed in electrical contact, by means the metallic conductive layer 50, with the adjacent first extremity of the strip 202 of the plurality of strips 201, 301 ... 20n, 30n in the top of FIG. 4, and so on. The arrangement of the detector in FIG. 4 allows a more compact detector with respect to the detector in FIG. 3.

Figure 5:
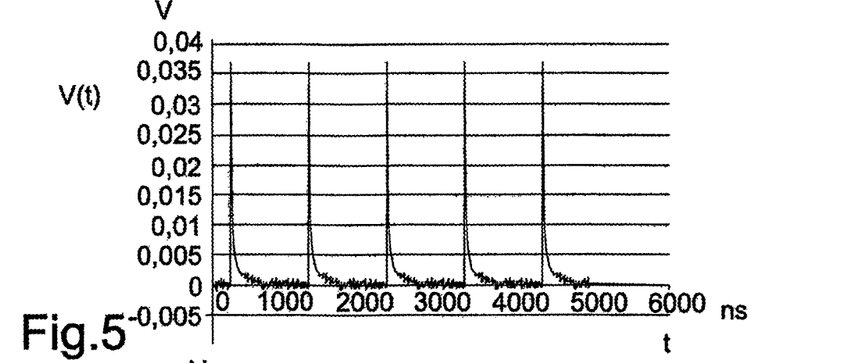
FIG. 5 is a graph of a transverse thermoelectric voltage signal as a function of time for the detector in FIG. 2 in response to irradiation by a train of 4-nanosecond pulses at 1 MHz repetition frequency, wherein the active layer is a layer of bismuth.

FIG. 5 is a graph schematically illustrating the transverse thermoelectric voltage signal V(t) as a function of time for the detector shown in FIG. 2 in response to irradiation laser RL by a train of 4-nanosecond pulses at 1 MHz repetition frequency.

Figure 6:
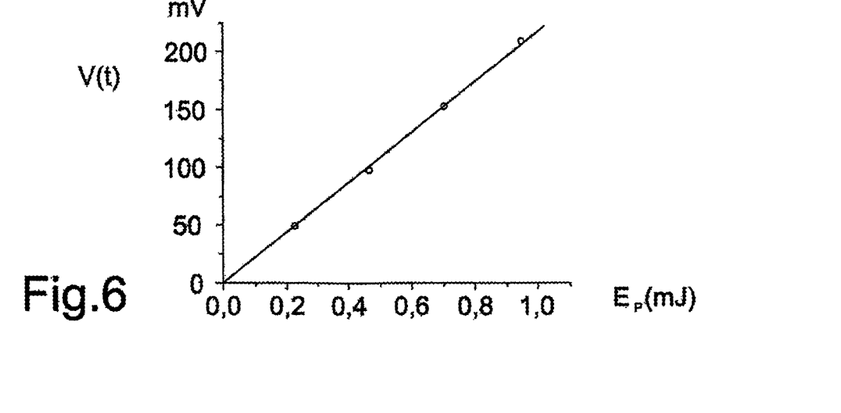
FIG. 6 is a graph of the response with respect to the incident pulse energy of the detector of FIG. 2, wherein the active layer is a layer of bismuth.

FIG. 6 is a graph schematically illustrating the transverse thermoelectric voltage signal V(t) with respect to the incident pulse energy $E_p$ for the detector in FIG. 2, wherein the active layer is a layer of bismuth.

Figure 7:
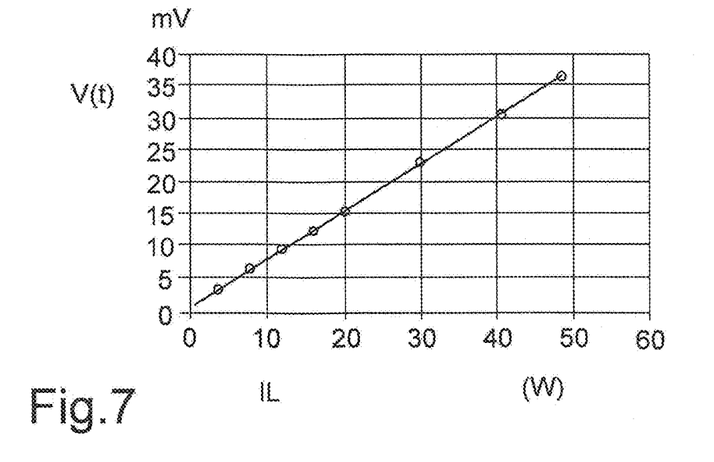
FIG. 7 is a graph of the measured value of the output voltage signal as a function of incident CW laser-radiation power of the detector in FIG. 3, wherein the active layer is a layer of bismuth.

FIG. 7 is a graph schematically illustrating the measured value of the transverse thermoelectric voltage signal V(t) as a function of the power IL of the incident CW laser-radiation RL for the detector in FIG. 3, wherein the active layer is a layer of bismuth.

Figure 9:
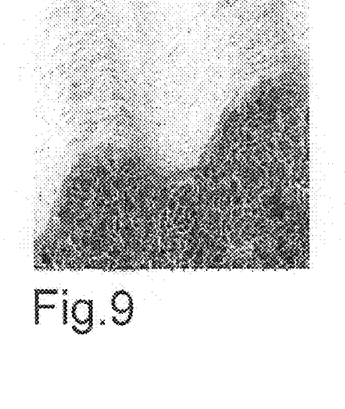
FIG. 9 is a scanning electron microscope image of the active layer, deposited on a ceramic substrate of the detector in FIG. 1, previously textured with V-shaped grooves.

According to a variant of the embodiment of the present invention, the top surface 10 of the substrate 1 is texturized (i.e. by laser scribing) forming adjacent V-shaped grooves in the same direction as the projection of the tilted grains of the active layer 2 onto the substrate of suitable dimensions, as shown in FIG. 9. In this way it is obtained a reduction of the reflectivity and a consequent enhancing of the optical light trapping.

According to another variant of the fast detector of the invention, an additional absorber layer 8 is deposited onto the layer 4. Suitable materials for this layer are SiC, $Si_3N_4$, $Al_2O_3$, TiO, carbon nanotubes or black textured metallic layers. Preferably, the range of thickness of this layer ranges from 0.1 to 20 µm, depending on the refractive index of the material and the spectral working region of the sensor. The use of the absorber layer occurs when the laser radiation is in the IR range (that is the wavelength of the laser radiation is comprised between 1.1 µm and 11 µm). The increase of thickness increases the response time of the sensor, while increasing its damage threshold to laser radiation.

The invention claimed is:

1. Detector of electromagnetic radiation, comprising:
a substrate,
an oriented polycrystalline layer of thermoelectric material deposited on the top surface of the substrate,
first and second electrodes spaced the one from the other and in electrical contact with the oriented polycrystalline layer,
wherein said substrate comprises at least one ceramic layer and said oriented polycrystalline layer has a crystal orientation at an angle comprised between 30 degrees and 55 degrees relative to a normal to the top surface of the substrate.

2. The detector according to claim 1, wherein said substrate is a ceramic layer.

3. The detector according to claim 1, wherein said substrate comprises a metallic layer which has been previously electrically passivated by a ceramic layer.

4. The detector according to claim 1, wherein said substrate has a crystal orientation different from that of the polycrystalline layer.

5. The detector according to claim 1, wherein at least one strip formed by the oriented polycrystalline layer which extends between the first and the second electrodes.

6. The detector according to claim 5, comprising a plurality of strips wherein each strip is formed by the oriented polycrystalline layer, said strips of the plurality of strips are spaced apart and are parallel to each other, the plurality of strips extending between the first and the second electrodes.

7. The detector according to claim 1, comprising a plurality of strips wherein each strip is formed by the oriented polycrystalline layer, said strips of the plurality of strips are spaced apart and are parallel to each other, said strips of the plurality of strips being arranged in succession from a first strip to the n-th strip, each strip of the plurality of strips having a first extremity and a second extremity, the first electrode being connected to first extremity of the first strip of the plurality of strips and the second electrode being connected to the second extremity of the n-th strip of the plurality of strips, the second extremity of each strip of the plurality of strips being in electrical contact with the first extremity of the successive strip of the plurality of the strips.

8. The detector according to claim 1, comprising a plurality of strips wherein each strip is formed by the oriented polycrystalline layer but wherein the oriented polycrystalline layers of the adjacent strips have opposite grain orientations, said strips of the plurality of strips are spaced apart and are parallel to each other, said strips of the plurality of strips being arranged in succession from a first strip to the n-th strip and wherein, each strip of the plurality of strips having a first extremity and a second extremity, the first electrode being connected to first extremity of the first strip of the plurality of strips and the second electrode being connected to the second extremity of the n-th strip of the plurality of strips, the second extremity of each strip of the plurality of strips being in electrical contact with the first extremity of the successive strip of the plurality of the strips.

9. The detector according to claim 1, wherein the top surface of the substrate present a roughness lower than 2 µm.

10. The detector according to claim 1, wherein comprising a passivation layer superimposed on the oriented polycrystalline layer.

11. The detector according to claim 10, comprising a buffer layer placed between the oriented polycrystalline layer and the passivation layer.

12. The detector according to claim 10, comprising an absorber layer placed over the passivation layer.

13. The detector according to claim 1, wherein the top surface of the substrate is texturized forming adjacent V-shaped grooves in the same direction as the projection of the tilted grains of the oriented polycrystalline layer.

14. The detector according to claim 1, wherein said at least one ceramic layer of the substrate is formed by a material selected from the group of materials which comprises sintered aluminum nitride (AlN), silicon nitride ($Si_3N_4$), silicon carbide (SiC) boron nitride (BN), boron carbide ($B_4C$), alumina ($Al_2O_3$) or beryllium oxide (BeO).

15. The detector according to claim 1, wherein said oriented polycrystalline layer is formed by a material selected from the group of materials which comprises bismuth (Bi), bismuth telluride ($Bi_2Te_3$), aluminum doped zinc oxide (Al:ZnO) or antimony (Sb).

16. The detector according to claim 1, wherein said substrate is a sintered ceramic layer.

17. The detector according to claim 1, wherein said polycrystalline layer is deposited by means of the glancing angle deposition technique.

18. The detector according to claim 1, wherein said first and second electrodes are made of the same material of said oriented polycrystalline layer of thermoelectric material.

* * * * *